(12) United States Patent
Van Der Putten et al.

(10) Patent No.: US 6,316,059 B1
(45) Date of Patent: Nov. 13, 2001

(54) METHOD OF PROVIDING A METAL PATTERN ON GLASS IN AN ELECTROLESS PROCESS

(75) Inventors: Andreas M. T. P. Van Der Putten; Nicolaas P. Willard; Lambertus G. J. Fokkink; Ivo G. J. Camps, all of Eindhoven (NL)

(73) Assignee: U.S. Philips Corporation, New York, NY (US)

(*) Notice: Subject to any disclaimer, the term of this patent is extended or adjusted under 35 U.S.C. 154(b) by 1331 days.

(21) Appl. No.: 08/573,921

(22) Filed: Dec. 18, 1995

Related U.S. Application Data

(63) Continuation of application No. 08/303,545, filed on Sep. 9, 1994, now abandoned, which is a continuation of application No. 08/055,427, filed on Apr. 21, 1993, now abandoned.

(30) Foreign Application Priority Data

Jun. 29, 1992 (EP) .................................................. 92201925

(51) Int. Cl.$^7$ ................................. B05D 5/12; B05D 3/06
(52) U.S. Cl. .......................... 427/558; 427/595; 427/98; 427/305; 427/306; 427/438; 427/443.1
(58) Field of Search ................................ 427/58, 96, 97, 427/98, 304, 305, 306, 438, 443.1, 558, 595

(56) References Cited

U.S. PATENT DOCUMENTS

| | | | |
|---|---|---|---|
| 3,791,340 | * | 2/1974 | Ferrara .................................. 427/558 |
| 3,978,252 | * | 8/1976 | Lombardo et al. ................... 427/299 |
| 4,261,800 | * | 4/1981 | Beckenbaugh ..................... 427/443.1 |
| 4,528,245 | * | 7/1985 | Jobbins ................................ 427/437 |
| 4,657,786 | * | 4/1987 | Sirinyan ............................... 427/306 |
| 4,725,314 | * | 2/1988 | Gulla et al. .......................... 106/1.11 |
| 4,748,104 | * | 5/1988 | Ferrier et al. ....................... 430/315 |
| 4,803,097 | * | 2/1989 | Fraenkel ............................. 427/305 |
| 4,900,582 | * | 2/1990 | Nakayama et al. ................. 427/54.1 |
| 4,904,328 | * | 2/1990 | Beecher ............................... 427/558 |
| 4,976,990 | * | 12/1990 | Bach et al. ............................ 427/98 |
| 4,996,075 | | 2/1991 | Ogawa et al. ........................ 427/12 |
| 5,077,085 | * | 12/1991 | Schnur et al. ........................ 427/98 |
| 5,079,600 | * | 1/1992 | Schnur et al. ........................ 357/4 |
| 5,233,067 | * | 8/1993 | Swei et al. ........................... 556/427 |
| 5,264,288 | * | 11/1993 | Das et al. ............................ 428/434 |

FOREIGN PATENT DOCUMENTS

36669 * 2/1985 (JP) ...................................... 427/305

* cited by examiner

*Primary Examiner*—Brian K. Talbot
(74) *Attorney, Agent, or Firm*—Norman N. Spain

(57) ABSTRACT

Metal patterns (15) can be provided on a glass substrate (1) in an electroless process by modifying the substrate with a silane layer (3), locally removing said layer with a laser or UV-ozone treatment and selectively nucleating the remaining silane layer in a polymer-stabilized Pd sol. Neither a photoresist nor organic solvents are used. The method is very suitable for the manufacture of the black matrix on a passive plate for an LCD, or on panels of other flat colour displays, such as flat cathode ray tubes.

2 Claims, 1 Drawing Sheet

METHOD OF PROVIDING A METAL PATTERN ON GLASS IN AN ELECTROLESS PROCESS

This is a continuation of application Ser. No. 08/303,545, filed Sep. 9, 1994, now abandoned, which is a continuation of application Ser. No. 08/055,427 now abandoned, filed Apr. 21, 1993.

BACKGROUND OF THE INVENTION

The invention relates to a method of providing a metal pattern on a glass substrate in an electroless process, in which method the substrate is provided with a silane layer which is subsequently exposed to actinic radiation in accordance with a pattern, after which the substrate is brought into contact with an aqueous metal-salt solution, thereby forming the metal pattern on the unexposed areas of the substrate.

The invention relates in particular to a method of manufacturing a black matrix of metal on a passive plate of a liquid crystal display device.

Electroless or chemical metallization is a simple and inexpensive method of metallizing dielectric substrates such as glass and synthetic resins. For this purpose electroless metallization baths, such as copper and nickel baths, are used which comprise complexed metal ions and a reducing agent. On catalytic surfaces the metal ions are reduced to metal. In general, metallic Pd nuclei are provided on the surface to be metallized in order to render the surface catalytic. In a standard procedure the substrate to be metallized is nucleated beforehand (termed activation) by bringing the substrate into contact with either aqueous solutions of, in succession, $SnCl_2$ and $PdCl_2$ or with a colloidal SnPd dispersion. As a result thereof Pd nuclei are formed on the surface to be metallized. Subsequently, the activated surface is immersed in an electroless metallization bath, causing the surface to be metallized. Such activation methods are non-selective, i.e. the entire substrate surface, such as glass, is nucleated and hence metallized. These activation methods, in which the strongly reducing formaldehyde is used as the reducing agent, can suitably be used for electroless copper. However, for most electroless nickel baths such activation methods are less suitable due to the reduced reactivity of the reducing agents, for example hypophosphite, used in these baths. This is caused by adsorbed $Sn^4$+particles which are used as stabilizers in electroless nickel baths, but which also inhibit the oxidation of the reducing agent.

In electronic applications, selective or patterned metallization is often desired. This can be attained in various ways. In a subtractive process, first a uniform metal layer having the desired thickness is deposited on the substrate. Subsequently, a photoresist layer is provided which is exposed in accordance with a pattern and developed, thereby forming a pattern in the resist layer. Finally, the metal layer is etched selectively after which the resist layer is stripped off. In an additive process the substrate is activated with catalytic Pd nuclei. Subsequently, a photoresist layer is provided on the substrate, exposed in accordance with a pattern and developed, thereby forming a pattern in the resist layer. Subsequently, the surface is immersed in an electroless metallization bath, in which process metal is deposited in the desired thickness in the aperture of the resist pattern. Finally, the resist layer is stripped off and the Pd nuclei are removed by a short etching treatment. Both processes have the disadvantage that they require a relatively large number of process steps and involve the use of chemicals which are harmful to the environment, such as the resist stripper and the metal-etching bath. In addition, the provision of resist layers on large glass surfaces is rather difficult.

It is also known to apply a Pd-acetate film to a glass plate by means of spin coating, which film is locally decomposed to metallic palladium by means of a laser. The Pd acetate on the unexposed parts is subsequently removed. The pattern of Pd nuclei thus formed is then metallized in an electroless nickel or copper bath. The disadvantage of this method is the relatively large number of process steps and the high laser power necessary to decompose the Pd acetate. Consequently, the treatment of large glass surfaces is very time-consuming.

In U.S. Pat. No. 4,996,075 a description is given of a method of depositing a very thin silver film in accordance with a pattern on a $SiO_2$ surface. In this method the surface is treated with a solution of a silane with a vinyl or acetylene group in an organic solvent such as carbon tetrachloride and chloroform. In this treatment a monomolecular silane layer is formed on the $SiO_2$ surface, i.e. a silane layer having a thickness equal to the length of the silane molecule is formed. Local irradiation of the silane layer with an electron beam causes the vinyl or acetylene groups to be chemically bonded to one another, thereby forming a polymer layer, and hence to be selectively deactivated. Subsequently, the surface is first immersed in a solution of diborane in THF and then in an alkaline solution of hydrogen peroxide, so that the unexposed vinyl groups are converted to hydroxyl groups. Subsequently the hydroxyl groups are converted to aldehyde groups. A treatment with an aqueous silver nitrate solution causes the silver ions to be reduced by the aldehyde groups to metallic silver, thereby forming a patterned silver layer having a thickness of one atom layer in the unexposed areas. A second monomolecular layer of vinyl silane can be formed on the silver oxide layer obtained by spontaneous conversion of the monoatomic silver layer to a monomolecular silver oxide layer, after which the above steps for converting vinyl groups via hydroxyl groups into aldehyde groups are repeated. Subsequently a second treatment with an aqueous silver nitrate solution is carried out, which results in the formation of a second monomolecular silver oxide layer. By repeating these steps many times an alternating laminate of monolayers of silane and monolayers of silver oxide is obtained.

A disadvantage of this known method is the large number of process steps required to obtain a metal pattern having of sufficient layer thickness, for example 0.1 μm or more, so that the layer is optically tight and/or has a sufficiently low electric resistance. Another disadvantage is the use of harmful organic solvents as a solvent for the silanes with a vinyl or acetylene group. A further disadvantage is formed by the fact that the proposed irradiation of the silane layer causes said layer to be deactivated by mutual bonding of the vinyl or acetylene groups, thereby forming a polymer layer which covers the $SiO_2$ surface. This polymer top layer cannot easily be removed and is often undesired. Due to said polymer layer the $SiO_2$ surface is inaccessible to other surface reactions or causes, for example, bonding problems with other layers to be provided.

SUMMARY OF THE INVENTION

It is an object of the invention to provide, inter alia, a method of providing a metal pattern on a glass substrate in an electroless process comprising relatively few process steps, and without using photoresist layers and organic solvents. A further object of the invention is to provide a method which can suitably be used for the patterned metallization of relatively large glass surfaces of, for example, 25×40 cm. A still further object of the invention is to provide a method which can suitably be used for an electroless nickel bath.

These objects are achieved by a method as described in the opening paragraph, which is characterized in that the silane layer is provided from an aqueous solution of silane and in that, during patterned irradiation, the silane layer is removed down to the substrate in the irradiated areas, after which the substrate is brought into contact with a Pd sol which is stabilized with a water-soluble polymer and, subsequently, the non-irradiated areas of the substrate are metallized in an electroless metallization bath, thereby forming the metal pattern. In this connection, the term "sol" is to be understood to mean a colloidal dispersion of Pd in water.

DETAILED DESCRIPTION OF THE INVENTION

Figure 1:
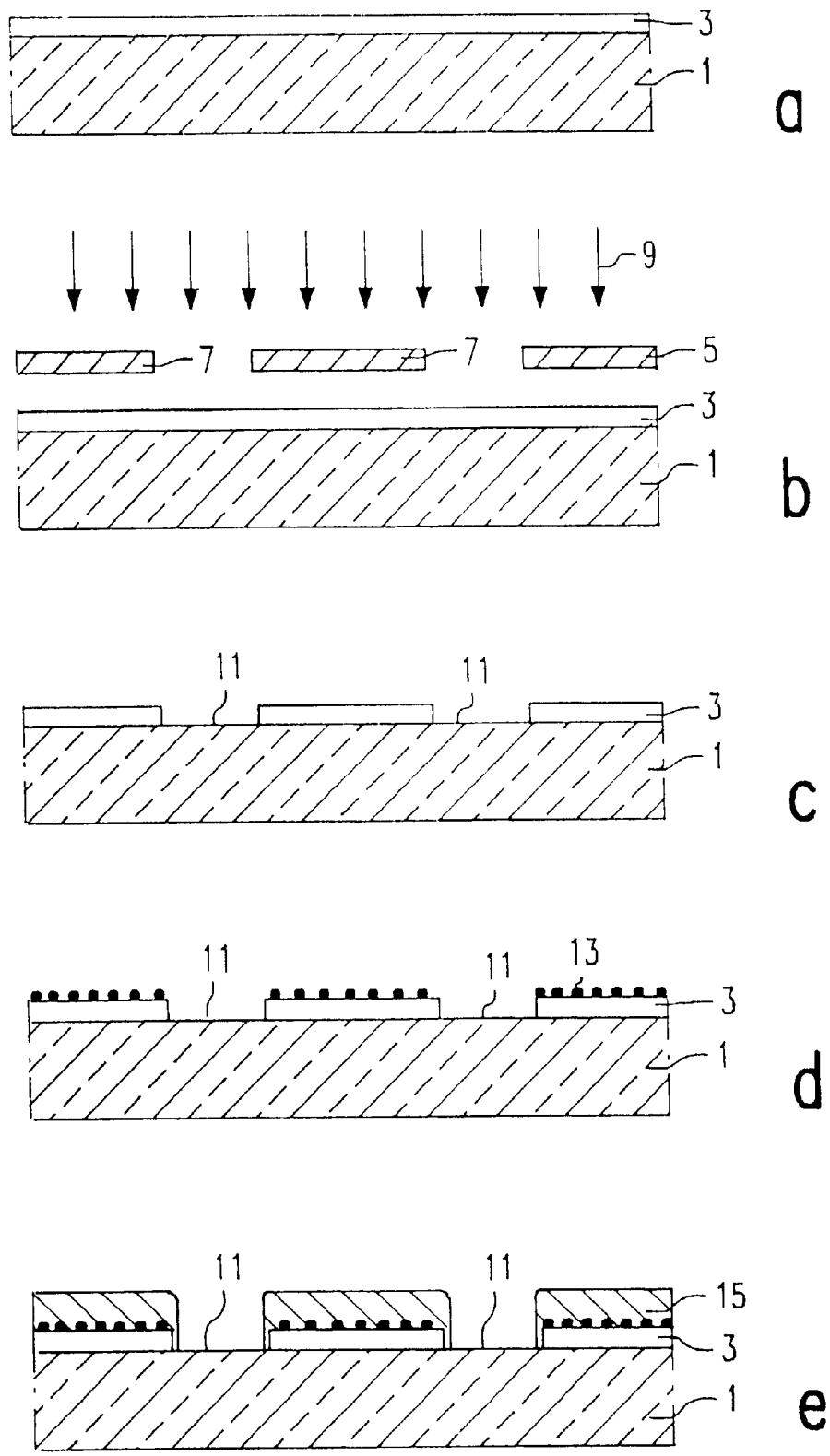
FIGS. 1a, 1b, 1c, 1d and 1e of the drawing are cross-sectional views showing various steps of the method of the invention.

The method is based on the observation that Pd particles which are stabilized with water-soluble polymers do not adsorb on glass surfaces, whereas on materials other than glass an excellent Pd coating is obtained. Surface modification of the glass surface by applying even monolayers of another material can influence the adsorption properties of the Pd nuclei. A glass surface can very suitably be modified by means of various silanes which form a chemical bond with the glass surface. Selective adsorption of Pd nuclei from polymer-stabilized Pd sols is attained by patterning the silane (mono) layer. The pattern in the silane layer is obtained by locally removing the silane layer by means of actinic radiation, for example using an ArF excimer laser, an oxygen plasma or an UV ozone treatment using a (shadow) mask or template. In places where the silane layer is removed, i.e. on the clean glass surface, no adsorption of Pd nuclei takes place, but at the silane layer adsorption of Pd nuclei does take place. The pattern of Pd nuclei is subsequently metallized in an electroless metallization bath, thereby forming the metal pattern.

By means of this method a very high density of Pd nuclei of $2.10^{15}$ Pd atoms per $cm^2$ is obtained, which leads to a very good initiation of not only electroless copper baths but also all less reactive electroless nickel baths which are commercially available. The high density of Pd nuclei also brings about a very satisfactory adhesion of the copper or nickel layer as well as a high selectivity for the metallization of the unexposed places relative to the exposed places. In this connection, it is possible to substitute glass by quart, quartz glass and glass ceramic such as Macor™. Also these latter materials are not activated by a polymer-stabilized Pd sol, but they are activated by the known SnPd sols and by $SnCl_2/PdCl_2$ activation. The Pd sol can be prepared by adding a suitable reducing agent, such as $H_3PO_2$ and dimethyl aminoborane, to an aqueous HCl-containing solution of a Pd salt, such as $PdCl_2$, Pd nitrate and Pd acetate, causing metallic Pd to be formed, this solution also comprising a water-soluble polymer which stabilizes the sol. Steric hindrance of the polymer chains on the Pd particles precludes flocculation of said particles.

Suitable, water-soluble polymers are polyvinyl alcohol (PVA) and polyvinyl pyrrolidone (PVP). In the case of PVA a heterodisperse sol is obtained having particles ranging from 2–10 nm. When PVP is used a monodisperse sol is formed having particles of 2 nm. A particle of 2 nm contains approximately 500 Pd atoms. The molecular weight and the polymer concentration are chosen to be such that per Pd particle one polymer chain is adsorbed at said particle. Preferably, PVP having an average molecular weight of approximately 10,000 is used (for example K-15 obtainable from Fluka). A relatively low average molecular weight in combination with said small particles brings about a high density of not only Pd nuclei on the substrate, resulting in an excellent initiation of the electroless metallization, but also nickel nuclei. Pd-PVP sols are more stable than Pd-PVA sols, so that the former sol has a longer life cycle. By virtue thereof a concentrated stock solution of a Pd-PVP sol can be prepared which is diluted, for example 10×, before use. Another advantage of PVP relative to PVA is that the formation of foam in the nucleating solution is reduced.

In accordance with the invention, aqueous solutions of silane are used to avoid the use of undesirable organic solvents. Suitable silanes are water-soluble aminosilanes comprising at least one alkoxy group. These silanes include those complying with the formula

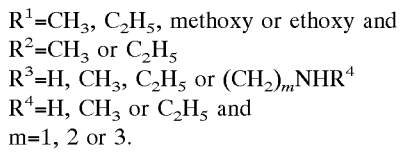

where
  $R^1=CH_3$, $C_2H_5$, methoxy or ethoxy and
  $R^2=CH_3$ or $C_2H_5$
  $R^3=H$, $CH_3$, $C_2H_5$ or $(CH_2)_mNHR^4$
  $R^4=H$, $CH_3$ or $C_2H_5$ and
  m=1, 2 or 3.

Suitable representatives are 3-aminopropyl triethoxysilane and N-(2-aminoethyl)-3-aminopropyl trimethoxysilane. An example of a substance which can also suitably be used is 3-aminopropyl dimethylmethoxysilane. The concentration of the silane used in water is not critical and ranges, for example, between 0.1 and 3% by weight. The immersion time of the substrate in the silane solution is not critical either for the subsequent Pd adsorption. One of the alkoxy groups of the silane molecule reacts with a hydroxy group of the glass surface and forms a chemical bond. Of course, prior to silanation, the glass surface must be cleaned to a sufficient degree.

The patterned removal of the silane layer is preferably effected by means of an UV-ozone treatment. A commercially available UV-ozone reactor comprises a low-pressure mercury discharge lamp generating two relevant wavelengths, namely 185 nm and 254 nm. The UV light having a wavelength of 185 nm is absorbed by oxygen from the atmosphere and generates ozone which, subsequently, absorbs the 254 nm radiation thereby forming atomic oxygen. In this atmosphere it takes two minutes to completely remove the silane layer from the glass surface at a temperature of 25° C. A material which is inert under said conditions is used as the mask, for example a foil of stainless steel which is provided with apertures having the desired pattern. During the UV-ozone treatment the silanated glass surface is covered with said foil which is provided with apertures. In the exposed parts of the glass surface, which correspond to the apertures in the foil, the silane layer is removed down to the glass. No nucleation takes place on the exposed parts in the subsequent activation treatment and these parts are not metallized.

In principle, other methods of locally removing the silane layer can alternatively be used, for example a method employing an oxygen plasma and a mask or by means of local exposure using a laser light beam as generated by, for example, an ArF excimer laser (wavelength 198 nm).

As stated above, the number of Pd atoms adsorbed at the glass surface amounts to $2.10^{15}$ per $cm^2$ if the method in accordance with the invention is used. If Pd-PVA sols are used a density of $3.10^{15}$ Pd atoms per $cm^2$ is attained. Said values are determined by means of XRF (X-ray fluorescence). Such a surface has a very catalytic effect and leads to a reliable electroless metallization process, even in the case of less reactive electroless nickel baths. All known electroless nickel baths can be used, for example nickel baths on the basis of glycine, succinate, pyrophosphate and citrate. Use can also be made of the known commercially available baths, such as Shipley 65™, OMI Enplate 426™, Shipley Niposit 468™, Enlyte 512 and 514™. In addition to a nickel salt such a bath always comprises a reducing agent such as hypophosphite or dimethyl aminoborane. Frequently, stabilizers such as sulphur compounds or lead salts are present to preclude the spontaneous deposition of nickel.

The method in accordance with the invention is particularly suitable for the manufacture of a black matrix of metal on a passive plate of a liquid crystal display device (LCD), in particular for passive plates having relatively large dimensions of, for example, 25×40 cm. The black matrix improves the contrast between the three colour filters red, green and blue of the colour filter pattern. Generally, a film chromium film is used for this purpose in which apertures are formed in a photolithographic process, i.e. providing the photoresist, exposing, developing, etching and stripping off the resist. These apertures constitute the pixels of the passive plate of the LCD and have dimensions of for example 50×70 μm. In accordance with the invention, a cleaned glass plate is treated with an aqueous solution of a silane, thereby forming a (monomolecular) layer of silane on the glass plate. The treated glass plate is covered with a mask having apertures with dimensions equal to the dimensions of the pixels. In an UV-ozone reactor the silane layer is removed from the supporting plate at the location of the mask apertures. Subsequently, an activation treatment using a Pd sol which is stabilized with a water-soluble polymer place. Then the unexposed areas are nickel plated by means of an electroless nickel bath, thereby forming said black matrix. At a thickness of 0.1 μm, the nickel layer is optically tight. The method in accordance with the invention is completely additive and, in addition, no use is made of photoresists and developers and etchants which are harmful to the environment. The colour filters are provided in the apertures by means of, for example, screen printing, ink-jet printing or lithographic techniques. After the colour filters are provided an equalizing layer and an ITO layer are successively provided. The method in accordance with the invention is also suitable for the manufacture of a black matrix of metal on face plates of other flat colour displays, such as flat cathode ray tubes. The method in accordance with the invention is also suitable for the manufacture of metal electrodes on glass selection plates of an electron fiber display such as described in European patent application EP-A400750.

Other applications of the method in accordance with the invention include the manufacture of conductor patterns for chip-on-glass and copper patterns for coils in minimotors.

The invention will be explained in greater detail by means of an exemplary embodiment and with reference to a drawing in which FIGS. 1a, 1b, 1c, 1d, and 1e digrammatically shows the process steps of the method in accordance with the invention.

Exemplary Embodiment

A polymer-stabilized Pd sol which can suitably be used in the method in accordance with the invention is pred as follows. A quantity of 0.6 ml of a $PdCl_2$ solution consisting of 10 g/l of $PdCl_2$ and 350 ml/l of concentrated hydrochloric acid in water is diluted with 38.4 ml of water. A quantity of 0.07 ml of a 1 wt. % polyvinyl pyrrolidone (PVP) solution in water is added to this solution. Said PVP is obtained from Fluka, type K-15, and has an average molecular weight of 10,000. Subsequently 1 ml of a 0.625 molar $H_3PO_2$ solution is added while stirring. The Pd sol formed is monodisperse with particles of 2 nm and is used as an activating solution.

FIGS. 1a–1e diagrammatically shows the process steps of the method in accordance with the invention, the glass test substrate and the layers to be provided being diagrammatically shown in cross-section.

A borosilicate glass plate 1 (FIG. 1A) having dimensions of 35×35 mm is used as the test substrate. Said test substrate is cleaned with an aqueous solution comprising 20 g of sodium gluconate, 25 g of sodium hydroxide and 3 g of Tensagex™ (wetting agent) per liter.

After rinsing with demineralized water the test substrate is immersed in a 0.3 wt. % solution of 3-aminopropyl triethoxysilane (A0750 obtainable from Petrarch) in water for 1 minute. By the reaction of an ethoxy group of said silane with an —SiOH group of the glass surface a silane layer 3 having a thickness of approximately 1–5 nm is formed on the glass surface. The silane used comprises three reactive ethoxy groups, so that the silane layer consists of a three-dimensional network (polysiloxane). If two ethoxy groups of said silane are substituted by methyl groups (A0735 available from Petrarch) a monolayer of said silane is formed on the glass surface. The modified test substrate is rinsed with demineralized water and dried.

On the modified test substrate he is provided a mask 5 (FIG. 1b) consisting of a 100 μm thick foil of Invar™ (NiFe alloy comprising 36 wt. % of Ni), in which a pattern of circular holes 7 having a diameter of 100 μm and a pitch of 200 μm is etched. The test substrate which is covered with the mask is placed in an UV-ozone reactor (manufactured by Samnco UV-1) at a temperature of 125° C. for 5 minutes. The arrows 9 denote the UV radiation. In the UV-ozone treatment the silane layer is completely removed in the exposed areas 11 (FIG. 1c).

Subsequently, the test substrate is immersed in the above-mentioned activating solution of PVP-stabilized Pd sol for 4 minutes. Pd nuclei 13 are formed in the unexposed areas of the test substrate (FIG. 1d). Said nucleation is selective: in the exposed areas there are no Pd nuclei. Surface analysis using TEM (Transmission Electron Microscopy) shows that the Pd nuclei have a diameter of 2 nm. XRF analysis shows a degree of coverage of $2.10^{15}$ adsorbed Pd atoms per $cm^2$.

The activating treatment is followed by rinsing in demineralized water, after which the activated test substrate is introduced into an electroless nickel bath comprising 20 g of $NiCl_2$, 16 g of sodium succinate, 10 g of sodium hypophosphite and 2 g of sodium acetate per liter of water. The nickel bath is acidified with HCl to a pH-value of 4.5 and has a temperature of 70° C. After three minutes a nickel layer 15 (FIG. 1E) having a layer thickness of 0.2 μm is obtained in the unexposed areas of the test substrate. In the circular exposed areas 11 no nickel is formed. In this manner, a patterned nickel layer having circular apertures with a diameter of 100 μm which correspond to the pattern in the mask is formed on the glass test substrate. The adhesion of the nickel layer to the glass surface satisfies the requirements of the tape test.

In the same manner as described above a glass supporting plate, having dimensions of 25×40 cm, for an LCD is provided with a black matrix, a mask having apertures of 50×70 μm which correspond to the dimensions of the pixels being used. The nickel pattern formed on the supporting plate forms the black matrix.

The method in accordance with the invention comprises four fundamental process steps, namely the glass surface, irradiating in accordance with a pattern, selectively activating with a stabilized Pd sol and electroless metallization in, for example, a nickel bath. This method enables a metal pattern to be provided on relatively large glass substrates in an electroless process comprising relatively few process steps and without using photoresists, developing liquids and organic solvents. Silanation and activation take place in aqueous solutions. A reliable electroless metallization process is obtained by virtue of the high density of the Pd nuclei attained during the activating treatment.

What is claimed is:

1. A method of providing a metal pattern on a glass substrate by an electroless process, said method comprising applying an aqueous solution of a silane to the surface of a glass substrate to thereby provide said substrate with a silane layer, providing a patterned mask on said silane layer, exposing said masked silane layer to UV radiation while subjected to ozone to thereby remove portions of the silane layer and expose the glass substrate in the irradiated portions, removing said mask, bringing said substrate into contact with a Pd sol, stabilized with a water-soluble polymer and having, as its sole metal, Pd, to thereby activate the remaining portions of the silane layer only and then bringing said substrate into contact with an electroless metallization bath to thereby form a metal pattern on glass.

2. A method of manufacturing a black matrix of metal on a passive plate of a liquid crystal display device by using the method as claimed in claim 1, said black matrix being formed by using an electroless nickel bath.

* * * * *